(12) United States Patent
Kuwazaki et al.

(10) Patent No.: US 6,247,640 B1
(45) Date of Patent: Jun. 19, 2001

(54) CONDUCTIVE PARTICLE ARRANGING DEVICE AND CONDUCTIVE PARTICLE TRANSFERRING METHOD USING THE SAME

(75) Inventors: Satoshi Kuwazaki; Kazushi Iwata; Yoshihiro Yoshida, all of Kanagawa; Tsutomu Sakatsu; Toshiaki Iwafuchi, both of Tokyo, all of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/481,389

(22) Filed: Jan. 12, 2000

Related U.S. Application Data

(62) Division of application No. 08/929,057, filed on Sep. 15, 1997, now Pat. No. 6,063,701.

(30) Foreign Application Priority Data

Sep. 14, 1996 (JP) .................................... 8-265627
Nov. 8, 1996 (JP) .................................... 8-312838

(51) Int. Cl.[7] ............................ B23K 31/00; B23K 35/38
(52) U.S. Cl. .................. 228/245; 228/180.22; 228/248.5
(58) Field of Search ............................... 228/180.22, 245, 228/180.21, 180.1, 248.5, 248.1; 438/616, 613, 614, 615; 257/737, 738

(56) References Cited

U.S. PATENT DOCUMENTS

| | | | |
|---|---|---|---|
| 4,092,445 | * | 5/1978 | Tsuzuki et al. . |
| 4,871,110 | * | 10/1989 | Fukasawa et al. . |
| 4,906,823 | * | 3/1990 | Kushima et al. . |
| 5,627,108 | * | 5/1997 | Alibocus et al. . |
| 5,839,191 | * | 11/1998 | Economy et al. . |
| 5,842,273 | * | 12/1998 | Schar . |
| 5,857,610 | * | 1/1999 | Hoshiba et al. . |
| 5,861,323 | * | 1/1999 | Hayes . |
| 5,976,965 | * | 11/1999 | Takahashi et al. . |
| 5,997,317 | * | 12/1999 | Pei et al. . |
| 6,063,701 | * | 5/2000 | Kuwazaki et al. . |
| 6,071,801 | * | 6/2000 | Wachtler et al. . |

* cited by examiner

Primary Examiner—Tom Dunn
Assistant Examiner—Jonathan Johnson
(74) Attorney, Agent, or Firm—Oblon, Spivak, McClelland, Maier & Neustadt, P.C.

(57) ABSTRACT

A device for arranging conductive particles in a preselected pattern for the connection of electric circuit boards or electric parts is disclosed. Particularly, a device capable of surely and efficiently transferring, e.g., solder bumps to the electrode pads of a semiconductor chip or the leads of a TAB (Tape Automated Bonding) tape and a conductive particle transferring method using the same are disclosed.

21 Claims, 16 Drawing Sheets

CONDUCTIVE PARTICLE ARRANGING DEVICE AND CONDUCTIVE PARTICLE TRANSFERRING METHOD USING THE SAME

CROSS-REFERENCE TO RELATED APPLICATION

This is a Division of application Ser. No. 08/929,057, filed on Sep. 15, 1997, and now U.S. Pat. No. 6,063,701.

BACKGROUND OF THE INVENTION

The present invention relates to a device for arranging conductive particles in a preselected pattern for the connection of electric circuit boards or electric parts. More particularly, the present invention is concerned with a device for surely and efficiently transferring solder bumps to the electrode pads of a semiconductor chip or the leads of a TAB (Tape Automated Bonding) tape, and a conductive particle transferring method using the same.

It is a common practice with, e.g., LSI (Large Scale Integration) circuits and LCDs (Liquid Crystal Displays) to connect electric circuit boards by using conductive particles.

After electric conduction has been set up between the circuit boards by the conductive particles, the circuit boards are fixed by an adhesive. Specifically, after the conductive particles have been arranged on either one of the circuit boards, an adhesive is applied and then set after the alignment of electrodes. To arrange the particles on the circuit board, they may be simply sprayed, as taught in, e.g., Japanese Patent Laid-Open Publication Nos. 2-23623 and 3-289070.

With the spraying scheme, however it is difficult to control the positions and the number of the particles on the electrodes. Particularly, when the electrodes are arranged at a fine pitch, the particles are apt to short the electrodes or to render the connection resistance irregular due to the irregular number thereof on the electrodes. Although the particles may be arranged on the electrodes while having their positions controlled, such an approach needs a sophisticated control system.

For the electrical connection of the electrode pads of a semiconductor chip and outside leads, a wire bonding system, a TAB system and a flip-chip bonding system are typical systems available at the present stage of development. The TAB system and flip-chip bonding system each uses conductive particles in the form of solder bumps (simply bumps hereinafter) for electrical connection. Specifically, in the TAB system, bumps intervene between the electrode pads of a semiconductor chip and the film-like leads of a TAB tape. In the flip-chip bonding system, bumps intervene between the electrode pads of a semiconductor chip and the leads of a circuit board.

Today, the following methods are extensively used to form bumps. In one method, the exposed portions of electrode pads provided on a semiconductor chip are covered with barrier metal. After a solder film pattern has been formed on the barrier metal, reflow and annealing are effected in order to cause the solder film to shrink on the barrier metal due to its own surface tension. In another method, bumps are formed on the electrode pads one by one by a wire bonder. Recently, a transfer bump method has been proposed which is advantageous over the above direct methods from the step and cost standpoint. The transfer bump method forms bumps on an exclusive transfer substrate by an electrolytic plating scheme. The bumps on the transfer substrate are aligned with the leads of a TAB tape in the TAB system or with the electrode pads of a semiconductor chip in the flip-chip bonding system. Then, the bumps are bonded by heat and transferred to the leads or the electrode pads. It is not too much to say that the the transfer bump method has broadened the applicable range of the TAB system.

However, the problem with the bumps formed by the electrolytic plating scheme is that they have flat surfaces and cannot be evenly transferred unless they have exactly the same height. In light of this, Japanese Patent Publication No. 7-27929 discloses a device capable of arranging spherical bumps on a transfer substrate. However, while the electrolytic plating scheme is capable of defining positions for forming the bumps beforehand, the spherical bumps are produced at random. Therefore, the key to the spherical bump scheme is how efficiently the bumps can be arranged in preselected positions. For the efficient arrangement of the bumps, the above document teaches that the diameter of the spherical bumps is strictly controlled. However, because the diameter of the bumps decreases with a decrease in the pitch of the electrode pads or that of the leads, it is extremely difficult to provide the bumps with the same diameter. As a result, the accuracy required of the flatness of the leads of a TAB tape, the flatness of a bonding tool and the parallelism of a transfer substrate and a TAB tape increases. The adjustment of such factors will become more difficult in the future in parallel with the progress of dense mounting.

SUMMARY OF THE INVENTION

It is therefore an object of the present invention to provide a simple, low cost device capable of arranging conductive particles adequately.

It is another object of the present invention to provide a method capable of transferring conductive particles to a semiconductor chip, TAB tape or intermediate transfer member more surely and easily without increasing accuracy required of a device for practicing it.

In accordance with the present invention, a device for arranging conductive particles for connecting electric circuit boards includes a mask formed with openings in a preselected pattern for arranging the conductive particles. A squeegee is spaced from the mask by a preselected distance and movable over the mask in a preselected direction for filling the conductive particles in the openings of the mask. A stage is positioned below the mask for holding the conductive particles filled in the openings of the mask. A vacuum suction mechanism is positioned below the stage for sucking, via the stage, the conductive particles being moved on the mask by the squeegee into the openings of the mask.

Further, in accordance with the present invention, a device for arranging conductive particles includes a feeding section for feeding the conductive particles. A stage is implemented as a porous flat plate having opposite major surface. One of the opposite major surfaces expected t o arrange the conductive particles is implemented as fine irregular surface for restricting the movement of the conductive particles. A mask is formed with openings in a preselected pattern for defining an arrangement of the conductive particles on the stage. A sucking mechanism sucks the conductive particles via the other major surface of the stage to thereby retain the conductive particles on the one major surface of the stage. A drive source is drivably connected to at least one of the stage and mask for selectively moving the one major surface of the stage and a major surface of the mask toward or away from each other.

Moreover, in accordance with the present invention, a method of transferring conductive particles includes the step of positioning a stage comprising a porous flat plate having one of opposite major surfaces thereof expected to arrange the conductive particles implemented as a fine irregular surface for restricting the movement of the conductive particles and a mask formed with openings in a preselected pattern for defining an arrangement of the conductive particles on the stage close to each other and parallel or substantially parallel to each other. In this condition, the conductive particles are from above the mask to thereby cause the openings of the mask to trap the conductive particles. Then, excess conductive particles other than the conductive particles trapped in the openings are removed from the mask. Subsequently, the mask and stage are separated from each other. Finally, the conductive particles arranged on the stage are transferred to another surface.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Preferred embodiments of the present invention will b e described hereinafter.

1st Embodiment

This embodiment relates to a conductive particle arranging device applicable to the bump forming step stated earlier.

Figure 1:
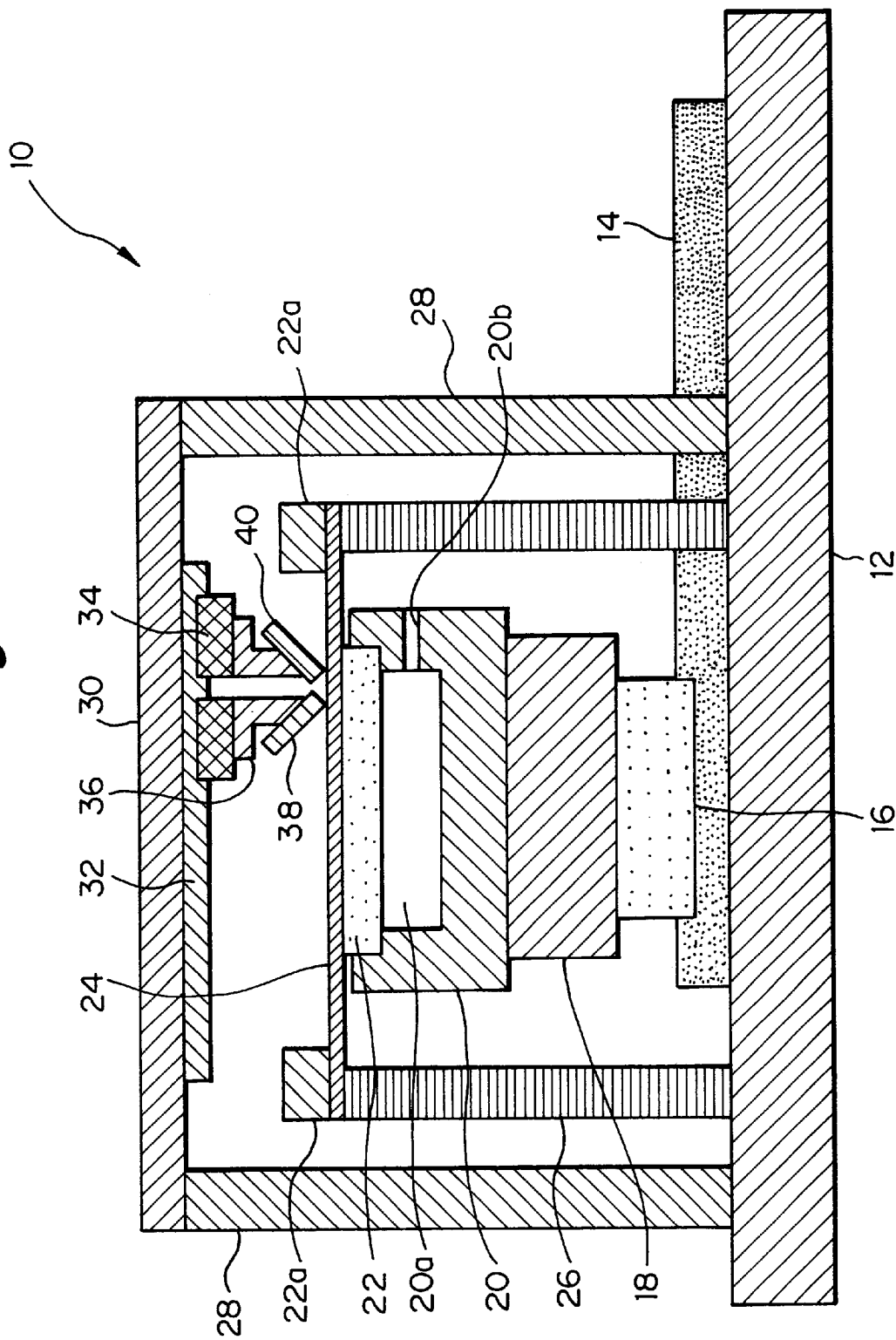
FIG. 1 is a sectional side elevation showing a first embodiment of the conductive particle arranging device in accordance with the present invention.

As shown in FIG. 1, the device, generally 10, includes a base 12 on which a guide rail 14 is mounted. A slider 16 is slidably mounted on the guide rail 14 and moved in the right-and-left direction, as seen in FIG. 1, by an air cylinder, not shown. A stage 18 is mounted on the slider 14 and shiftable up and down over a distance of about 10 mm by being driven by, e.g., an air cylinder.

A pedestal 20 is mounted on the stage 18 and implemented as a box-like or hollow cylindrical top-open member. The pedestal 20 has a bore 20a fluidly communicated to a vacuum pump, not shown, via a passageway 20b. A stage 22 is mounted on the pedestal 20, closing the open top of the pedestal 20. The stage 22 is implemented by a sintered ceramic body. The pedestal 20 carrying the stage 22 thereon has its bore 20a evacuated by the vacuum pump via the passageway 20b.

A mask 24 is held on and in contact with the top of the stage 22. The mask 24 is implemented as a metal mask by way of example and formed with openings, not shown, in a preselected pattern for arranging conductive particles. If conductive particles to be arranged by the device 10 have a diameter of, e.g., 40 $\mu$m, then the above openings each has a diameter of 50 $\mu$m and a depth of 40 $\mu$m. A frame 22a retains the peripheral portion of the mask 22 while a guide frame 26 guides and holds the peripheral portion of the mask 22. The mask 24 with the openings is mounted on the stage 22 which is, in turn, mounted on the pedestal 20, as stated above. Therefore, when the bore 20a of the pedestal 20 is evacuated, vacuum is developed in the openings of the mask 24 via the stage 22.

A frame 30 is supported by posts 28 above the mask 24. Sliders 32 and 34 are mounted on the frame 30 and driven horizontally by an air cylinder or a stepping motor, not shown, in directions perpendicular to each other. A pair of squeegees 38 and 40 are affixed to the slider 34 facing the mask 24 via a jig 36. The jig 36 is made up of a Z axis stage implementing adjustment in the vertical direction (Z direction), as seen in FIG. 1, and a goniometer implementing the adjustment of the angles of the squeegees 38 and 40, although not shown specifically.

The squeegees 38 and 40 are positioned above and at a preselected distance from the mask 24. When the sliders 32 and 34 are moved in the horizontal direction, the slider 34 moves the squeegees 38 and 40 in the horizontal direction. Conductive particles are fed to the mask 24 via the gap between the squeegees 38 and 40.

The device 10 having the above construction will be operated as follows. Initially, the squeegees 38 and 40 are located at their initial position or home position defined at the right-hand side or the left-hand side of the openings of the mask 24. Conductive particles are present between the squeegees 38 and 40. The stage 18 is held in its elevated position, maintaining the stage 22 in contact with the mask 24. The bore 20a of the pedestal 20 is evacuated by the vacuum pump.

In the above condition, the squeegees 38 and 40 are moved over the openings of the mask 24 at the same time by the sliders 32 and 34. As a result, the squeegees 38 and 40 move away from the home position while sequentially filling the openings of the mask 24 with the conductive particles. Because the bore 20a of the pedestal 20 is evacuated, air is sucked out of the openings of the mask 24 via the stage 22. Consequently, the particles fed to the mask 24 are surely introduced into and held in the openings of the mask 24.

When the movement of the squeegees 38 and 40 ends, the evacuation of the bore 20a is interrupted while the stage 18 is lowered. As a result, the mask 24 and stage 22 are separated from each other. When the slider 16 is moved along the guide rail 14, the conductive particles have been adequately arranged on the stage 22 in the desired pattern.

Figure 2:
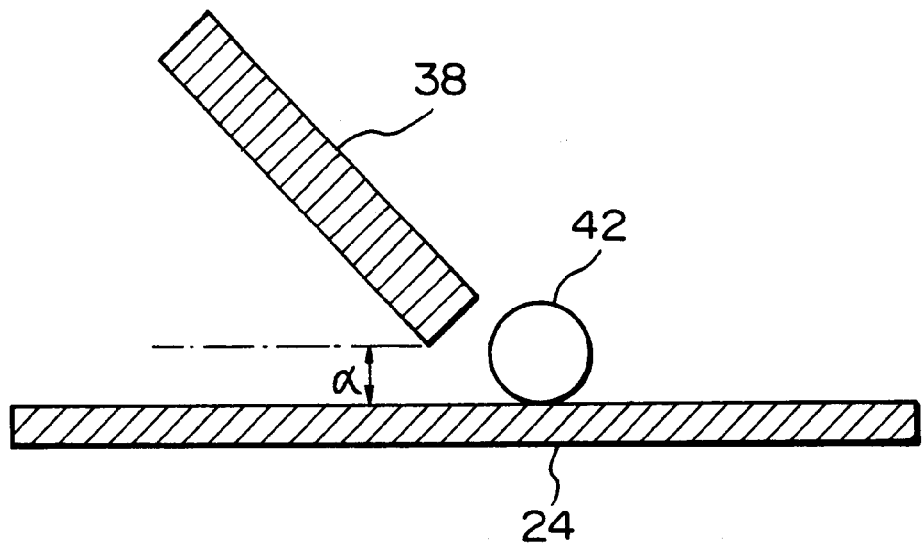
FIGS. 2–7 are sectional side elevations each showing a particular modification of a squeegee included in the first embodiment.

As shown in FIG. 2, the illustrative embodiment allows the distance between the mask 24 and the squeegees 38 and 40 to be smaller than the diameter of a conductive particle 42. Specifically, in the illustrative embodiment, the mask 24 and squeegees 38 and 40 (only the squeegee 38 is shown) are spaced from the mask 24 by a distance a smaller than the diameter of the particle 42. The distance a should preferably be one-half to one-fourth of the diameter of the particle 42. In such a configuration, the particle 42 is prevented from escaping via the gap between the mask 24 and the squeegees 38 and 40. This allows the particle 42 to be surely filled in the opening of the mask 24 and frees the mask 24 from wear or breakage.

Figure 3:
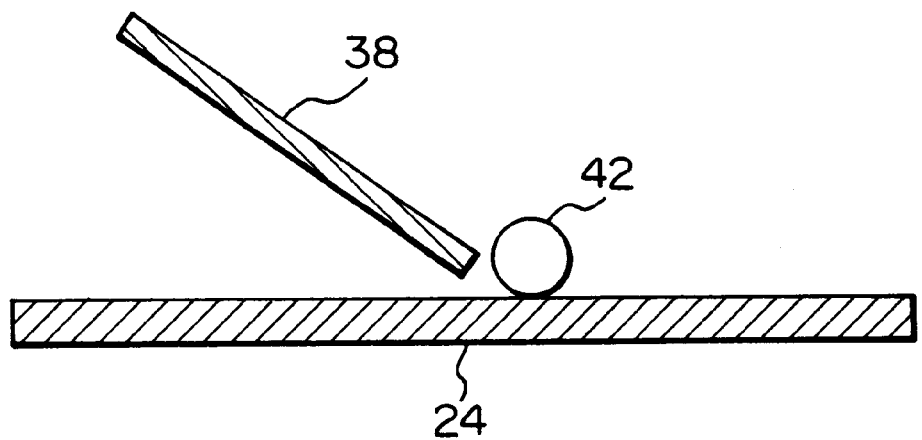

As shown in FIG. 3, the thickness of the squeegees 38 and 40 (only the squeegee 38 is shown) may be reduced below the diameter of the particle 42. Specifically, in the illustrative embodiment, each of the squeegees 38 and 40 has at least its lower edge provided with a thickness smaller than the diameter of the particle 42. With this configuration, the squeegees 38 and 40 can move the particle 42 smoothly on and along the mask 24.

Figure 4:
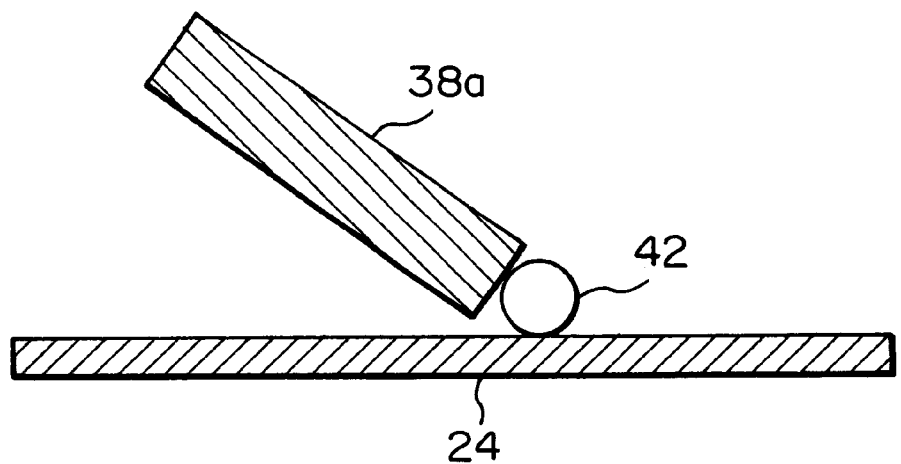

More specifically, assume a squeegee 38a shown in FIG. 4 and having a thickness greater than the diameter of the particle 42. Then, it is likely that the particle 42 gets between the squeegee 38a and the mask 24 and cannot smoothly move on the mask 24. By contrast, the squeegee 38 shown in FIG. 3 allows the particle 42 to easily slip away upward and smoothly move on the mask 24. Therefore, even when the particle 42 is implemented as a resin particle plated with metal, it can smoothly move on the mask 24 and adequately enters the opening of the mask 24 without being damaged.

Figure 5:
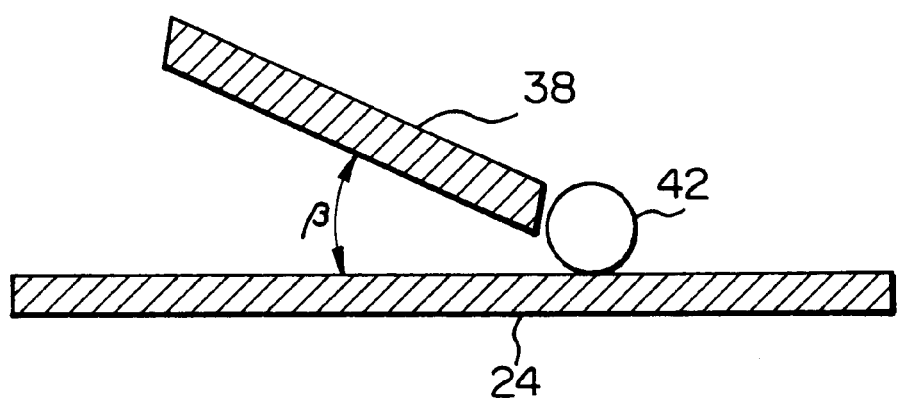

As shown in FIG. 5, the angle between each of the squeegees 38 and 40 (only the squeegee 38 is shown) and the mask 24 may be selected to be less than 30 degrees inclusive. The flat squeegee 38 is inclined relative to the mask 24 by an angle β of less than 30 degrees inclusive. This also allows the conductive particle 42 to easily slip away upward, i.e., prevents it from getting between the squeegee 38 and the mask 24 and being damaged thereby. Therefore, even when the particle 42 is implemented as a resin particle plated with metal, it can smoothly move on the mask 24 and adequately enter the opening of the mask 24 without being damaged.

Figure 6:
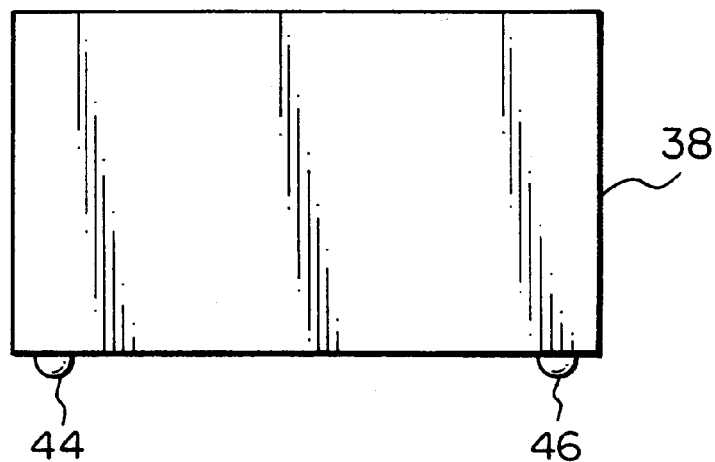
Figure 7:
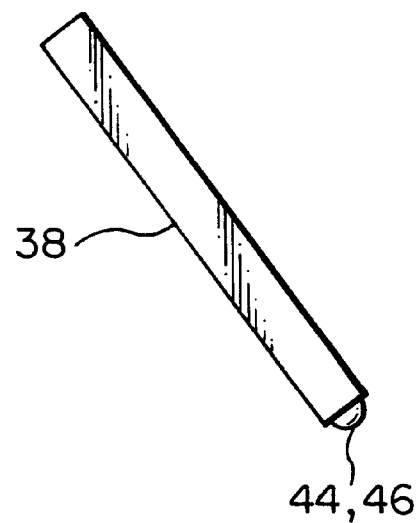

As shown in FIGS. 6 and 7, projections 44 and 46 may be provided on the lower edge of each of the squeegees 38 and 40 (only the squeegee 38 is shown) facing the mask 24, so that an adequate distance can be maintained between the squeegees and the mask 24. In the illustrative embodiment, the projections 44 and 46 are positioned at opposite ends of the lower edge of each of the squeegees 38 and 40. The projections 44 and 46 each has a height which is less than one-half of the diameter of the conductive particle 42 inclusive. Specifically, when the diameter of the particle 42 is 40 μm, resin beads whose diameter is 10 μm to 20 μm may be affixed to the above positions of the lower edge of the squeegee by, e.g., an adhesive.

When the squeegees 38 and 40 are moved above the mask 24 with their projections 48 and 40 contacting the mask 24, a preselected distance is surely maintained between the squeegees 38 and 40 and the mask 24. This is an economical, yet adequate, implementation for preventing the particle 42 from escaping and causing the mask 24 to wear.

Figure 8:
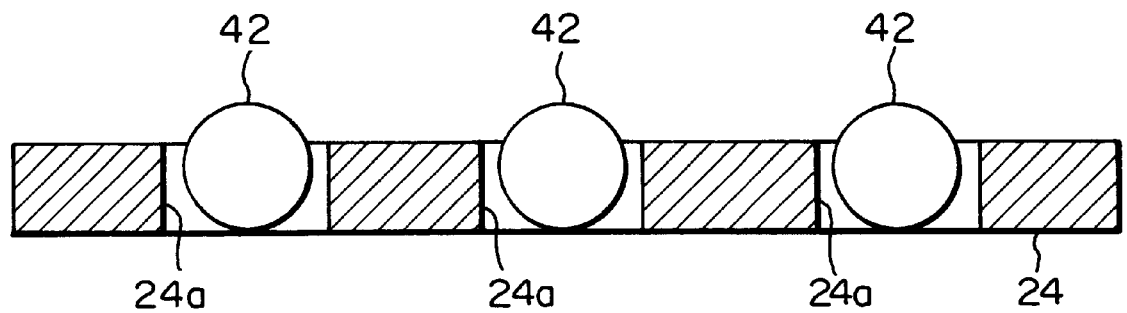
FIG. 8 is a sectional side elevation showing a modification of a mask also included in the first embodiment.

As shown in FIG. 8, the mask 24 may be provided with a thickness smaller than the diameter of the particle 42, but greater than one-half of the same. Specifically, the mask 24 is formed with a plurality of openings 24a. In the illustrative embodiment, the thickness of the mask 24 is selected to be smaller than the diameter of the particle 42, but greater than one-half of the same. Therefore, when such particles 42 are introduced into the openings 24a of the mask 24 laid on the stage 22, the particles 42 rest on the top of the stage 22. In this condition, less than one-half of each particle 42 protrudes from the top of the mask 24. The particles 42 received in the openings 24a of the mask 24 are delivered to the next step. In the next step, a transfer head, not shown, is lowered onto the mask 24 with the result that the particles 42 each protruding from the top of the mask 24 are transferred to the head.

With the configuration shown in FIG. 8, it is possible to deliver the mask 24 and stage 22 to the next step together, i.e., without lowering the stage 18 in order to separate the mask 24 and stage 22. This reduces the number of steps of the device 10 and thereby promotes smooth and adequate arrangement of conductive particles.

Figure 9:
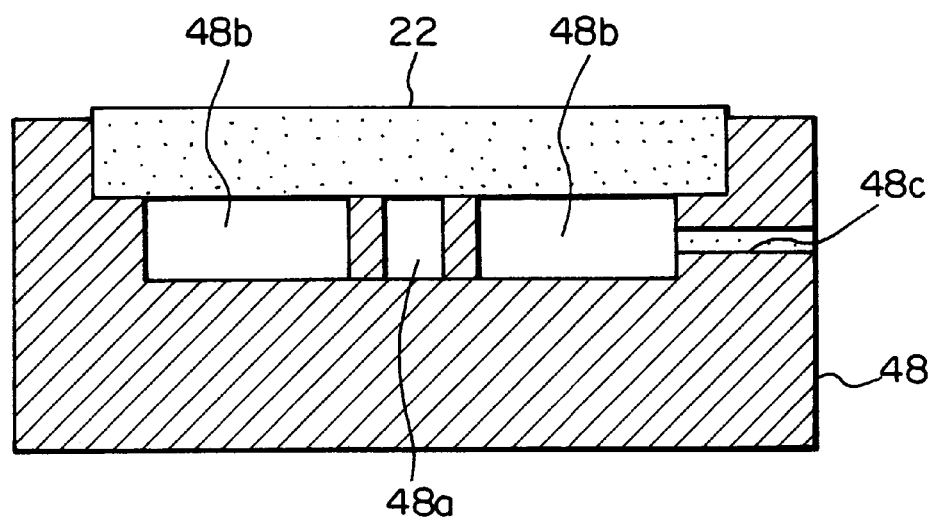
FIG. 9 is a sectional side elevation showing a modification of a pedestal and stage further included in the first embodiment.

FIG. 9 shows an alternative configuration of the pedestal 20. As shown, the box-like or hollow cylindrical pedestal, labeled 48, has a center bore 48a and a peripheral bore 48b surrounding the center bore 38a, i.e., a double bore structure. The pedestal 48 is formed with a passageway 48c communicated to the peripheral bore 48b and a passageway, not shown, communicated to the center bore. The passageway 48c and the other passageway, not shown, each is fuidly communicated to a respective vacuum pump, not shown, and evacuated thereby.

The stage 22 implemented as a sintered ceramic body is mounted on the top of the pedestal 48, closing the center bore 48b and peripheral bore 48b. The mask 24 with the openings 24a is mounted on the stage 22, although not shown specifically. The conductive particles 42 are received in the openings 24a of the mask 24 positioned above the center bore 48a.

The center bore 48a and peripheral bore 48b of the pedestal 48 each is evacuated by the respective vacuum pump, as stated above. When the mask 24 having the particles 42 in its openings and the stage 22 are separated from each other, the pump communicated to the center bore 48a above which the particles 42 are arranged is turned on while the other pump communicated to the peripheral bore 48b is turned off. As a result, the particles 42 are prevented from being displaced. This can be done with miniature vacuum pumps at a low cost.

While the mask 24 has been shown and described a s comprising a metal mask, it may alternatively be implemented by, e.g., a polyimide film or similar resin film. With a polyimide film, it is possible to form the openings 24a and therefore to arrange the particles 42 more accurately than with a metal mask when use is made of an excimer laser. It is to be noted that the openings 24a formed by an excimer laser are tapered. From the accuracy standpoint, therefore, the particles 42 should preferably be directly transferred to a transfer head without the mask 24 being separated.

As stated above, the first embodiment achieves the following advantages.

(1) The device is capable of arranging conductive particles adequately with a simple, low cost structure.

(2) The particles are prevented from escaping via a gap between squeegees and a mask and causing the mask to wear or break.

(3) The particles are prevented from getting between the squeegees and the mask. Therefore, even when the particles are implemented as resin particles plated with metal, they are free from breakage.

(4) The squeegees are constantly spaced from the mask by a preselected distance during movement.

(5) The particles received in the openings of the mask can be directly transferred to a transfer head, so that the number of steps is reduced.

(6) When the stage is separated from the mask, only the portion around the particles is evacuated in order to prevent the particles from being displaced.

(7) The openings of the mask can be formed more accurately than the openings of a metal mask.

2nd Embodiment

Figure 10:
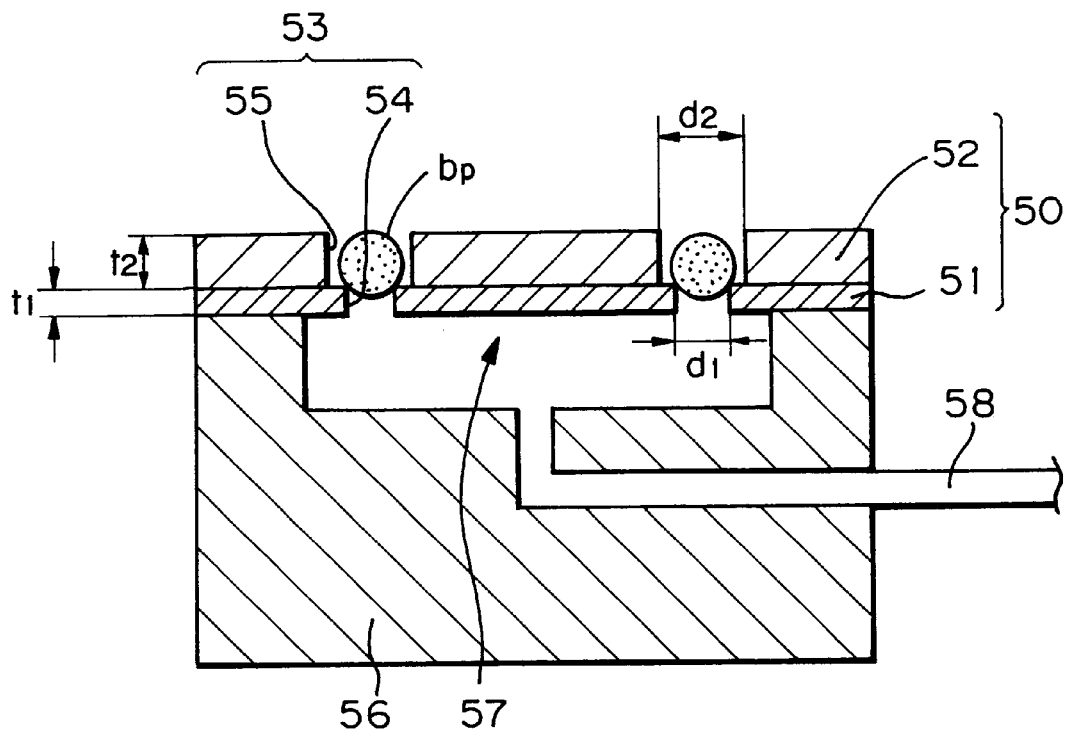
FIG. 10 is a section showing a conventional conductive particle arranging device.

To better understand this embodiment, reference will be made to FIG. 10 showing the conventional arrangement taught in Japanese Patent Publication No. 7-27929 mentioned earlier. The arrangement to be described addresses irregular transfer particular to the transfer bump method which forms conductive particles, i.e., bumps on an exclusive transfer substrate by electrolytic plating, and then transfers the bumps to the electrode pads of a semiconductor chip or the leads of a TAB tape. As shown in FIG. 10, a transfer substrate 50 is formed with through holes 53. The holes 53 each has a smaller diameter than a bump bp at its bottom, but has a greater diameter than the bump bp at its top. With this configuration, the substrate 50 itself plays the role of a jig for positioning the bumps bp. The bottom side of the substrate 50 is depressurized in order to retain the bumps bp in the holes 53 by suction. Specifically, a bore 57 formed between the substrate 50 and a holder 56 supporting it is evacuated via an tubing 58.

More specifically, the substrate 50 is implemented as a laminate of two flat sheets 51 and 52. The sheets 51 and 52 are respectively formed with openings 54 having a diameter $d_1$ smaller than the diameter of the bumps bp, and openings 55 having a diameter $d_2$ greater than the same. The openings 54 and 55 are aligned with each other, constituting the through holes 53. The holes 53 each has such a depth that less than one-half of the the bump bp, inclusive, introduced therein protrudes from the top of the substrate 50. In practice, the thicknesses $t_1$ and $t_2$ of the sheets 51 and 52, respectively, are optimized. The bumps bp arranged on the substrate 50 are transferred to, e.g., the leads of a TAB tape. Subsequently, the TAB tape is bonded to a semiconductor chip.

The bumps bp each is assigned to one electrode pad or one lead. Therefore, if the transfer of the bump to even one of several tens to a hundred and tens of electrodes or leads fails, the semiconductor chip is rejected. The conventional device transfers the bumps bp while retaining them in the holes 53, so that the amount of protuberance of the bumps bp necessary for transfer is not achievable without resorting to strict control over the diameter of the bumps bp. However, the bumps decrease in diameter with a decrease in the pitch between nearby electrode pads or leads, making it more difficult to evenly control the diameter of the bumps bp.

The embodiment to be described realizes easy and sure transfer of bumps or conductive particles to a semiconductor chip or a TAB tape.

Basically, in this embodiment, the support for the conductive particles and the definition of a particle arrangement each is assigned to one of two independent members. The two members are moved toward each other for particle arrangement and then moved away from each other for particle transfer, so that the particles can be transferred in their fully exposed position. Assume that the particles are bumps. Then, this embodiment is capable of surely transferring the bumps with a high throughput without resorting to strict control over the height of the bumps, the flatness of the leads of a TAB tape, and the flatness of a bonding tool.

A conductive particle arranging device embodying the above concept needs a stage for laying conductive particles, a mask for defining a particle arrangement, and drive means drivably connected to at least one of the stage and mask. For the simplest construction and control, the drive means may be connected only to the stage in order to move the stage up and down relative to the mask fixed in place.

The particles can be fixed in place on the stage to a certain degree if the stage is implemented as a flat porous plate, and if suction is applied to the rear of the stage. In this embodiment, the stage is additionally provided with an irregular surface for arranging the particles, so that the particles can be prevented from being displaced when the stage and mask are separated from each other. The irregular surface may be implemented by fine lugs formed on the above surface or by a mesh whose mesh size is smaller than the diameter of the particles.

The fine lugs may be formed in either one of a regular pattern and an irregular or random pattern. A simple method for forming the irregular pattern consists in spraying a solution of thermosetting resin or that of ultraviolet (UV) curable resin onto the particle arranging surface of the stage, and curing the resulting fine drops by use of heat or UV rays. On the other hand, to form the regular pattern most simply, use may be made of the patterning of photoresist. With the patterning scheme, it is possible to freely select even the relation between the pitch of the fine lugs and that of the particles. If the pitch of the lugs is greater than the pitch of the particles, each particle will be trapped between two nearby lugs. If the former is smaller than the latter, each particle will be caught by a plurality of adjoining lugs.

The fine lugs or the mesh may at least partly be provided with tackiness to act on the particles. For this purpose, the lugs themselves may be formed of an adhesive material, or an adhesive material may be applied to the mesh. The adhesive material may be implemented by a silicone resin or an acryl resin. If desired, the mesh may be selectively provided with tackiness in its region corresponding to the region of the mask adjoining the openings, but not provided with it in the peripheral regions of the stage. This protects the mask from needless contamination.

In the illustrative embodiment, the drive means may include a tilting mechanism for causing the major surface of the stage and that of the mask to tilt by a small angle from their parallel position. When the stage and mask are separated from each other after the arrangement of the particles, the tilting mechanism reduces the sharp inflow of air and thereby prevents the particles from being displaced or flying about.

A bump arranging device with high practicability is achievable if the openings of the mask each is so sized as to trap a single particle, and if the particle is implemented as a conductive particle for forming a solder bump.

In the illustrative embodiment, two different particle arranging methods are available for the transfer of the particles to another surface, depending on the operating timing of the above tilting mechanism. A first method is to slightly lower the degree of parallelism of the stage and mask at the time of arrangement of the particles. A second method is to arrange the particles while maintaining the stage and mask parallel to each other, slightly lower the degree of parallelism at least in the initial stage of separation of the stage and mask, and then restore the original parallelism when the danger of the sharp inflow of air has decreased. In any case, when the drive means is connected to the stage, the stage will be caused to tilt relative to the horizontal mask.

It is to be noted that "another surface" to which the particles are to be transferred refers to a TAB tape having leads, a semiconductor chip having bare pad electrodes, or a n intermediate transfer member preceding the TAB tape or the semiconductor chip.

Examples of the second embodiment are as follows.

EXAMPLE 1

Figure 11:
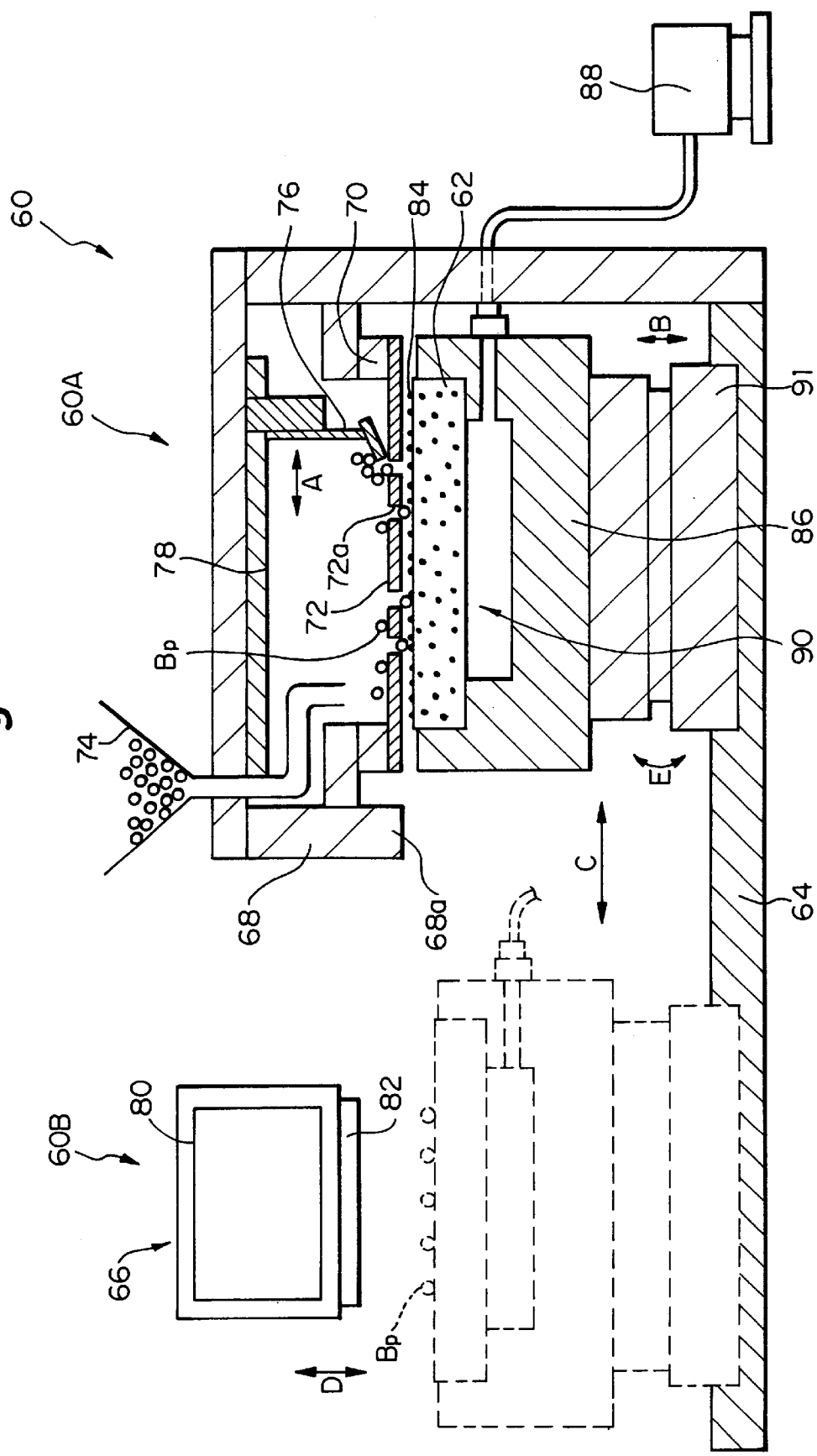
FIG. 11 is a section showing Example 1 of a second embodiment of the present invention.

FIG. 11 shows a conductive particle arranging device including a stage having fine lugs formed by spraying and then curing a UV curable resin. As shown, the device, generally 60, includes a movable stage 62 and a fixed mask 72. The stage 62 is movable along a guide rail 64. A bump arranging section 60A and a bump transferring section 60B are respectively arranged at one end (right-hand side as seen in FIG. 11) and the other end (left-hand-side as seen in FIG. 11) of the guide rail 64. Drive means, not shown, moves the stage 62 back and forth between the two sections 60A and 60B in a direction indicated by an arrow C. As a result, the arrangement of bumps Bp on the stage 62 and the transfer of the bumps Bp to a transfer head 66 are effected alternately.

The bump arranging section 60A is surrounded by a frame 68 whose one end is open in the form of a gate 68a for the ingress and egress of the stage 62. The mask 72 is supported by a mask holder 70 which is, in turn, supported by the frame 68. The bumps Bp are fed from above the mask 72 via a piping 74. A squeegee 76 collects the bumps Bp not arranged on the mask 72, i.e., excess bumps Bp. A guide rail 78 allows the squeegee 76 to move therealong only in a direction indicated by an arrow A. The squeegee 76 is driven by drive means, not shown.

The mask 72 is implemented as an about 40 $\mu$m thick nickel sheet and formed with openings 72a each being so sized as to trap a single bump Bp. The bumps Bp had a mean diameter of about 40 $\mu$m while the openings 72a had a diameter of about 50 $\mu$m. In Example 1, the mask 72 is fixed in its horizontal position.

The gap between the squeegee 76 and the mask 72 is selected to be less than one-half of the diameter of the bumps Bp inclusive, i.e., less than 20 $\mu$m inclusive, so that the squeegee 76 can collect all the excess bumps Bp.

In the bump transferring section 60B, the transfer head 66 includes optics 80 for exposure. A quartz window 82 coated with an adhesive paint is provided on the surface of the head 66 which will face the stage 62. The optics 80 fixes the bumps Bp to the electrode pads of an LSI chip, not shown, by using a UV curable adhesive. For this purpose, the optics 80 includes a light source for feeding optical energy for the curing reaction of the adhesive, and an optical fiber for evenly guiding light issuing from the light source to the quartz window 82.

The head 66 is movable up and down in a direction indicated by an arrow D in order to adhere the bumps Bp of the stage 62 to the quartz window 82 and then transfer the bumps Bp to the LSI chip, not shown, at another place. The stage 62 is formed of ceramics or similar porous material. A great number of fine lugs 84 each being about 10 $\mu$m high are formed on the surface of the stage 62. The lugs 84 not only restrict the movement of the bumps Bp on the particle arranging surface of the stage 62, but also prevent the particle arranging surface and mask 72 from closely contacting each other. The above specific height of the lugs 84 was selected in order to prevent two or more bumps Bp from gathering at a single position. In Example 1, the lugs 84 were formed by spraying a UV curable resin dissolved in a suitable solvent onto the stage 62, and then curing the drops of the solution by UV radiation.

The stage 62 is supported by the stage holder 86 along its edges. A chamber 90 is formed between the rear of the stage 62 and the stage holder 86 and fluidly communicated to an evacuating unit 88. In this configuration, the bumps Bp each being trapped in one opening 72a of the mask 72 are restricted in position on or between the lugs 84, and additionally restricted by suction acting from the rear of the stage 62.

The stage holder 86 is fixed to an elevatable base 91 engaged with the guide rail 64 stated earlier. The base 90 is moved in the direction C while carrying the stage 62 thereon.

The base 91 is extendable in a direction indicated by an arrow B and allows the distance between the stage 62 and the mask 72 to be adjusted when they are conveyed to the bump arranging section 60A. The amount of extension in the direction B does not have to be uniform over the entire stage 62. For example, an actuator may be used to cause the base 91 to extend more at one end of the stage 62 than at the other end of the stage 62. This allows the particle arranging surface of the state 62 to slightly tilt from horizontal in a direction E when the bumps Bp are arranged on the stage 62 or when the stage 62 carrying the bumps Bp is moved away from the mask 72.

In the above configuration, the transfer of the bumps Bp is effected without regard to the mask 72. Therefore, all the bumps Bp arranged on the stage 62 can be transferred to another surface without resorting to sophisticated control over the height of the bumps Bp, as measured from the surface of a substrate, and bump diameter.

EXAMPLE 2

In Example 2, the particle arranging device 60 was used to actually transfer the bumps Bp to the electrode pads of an LSI chip. The transfer will be described with reference to FIGS. 12–17.

Figure 12:
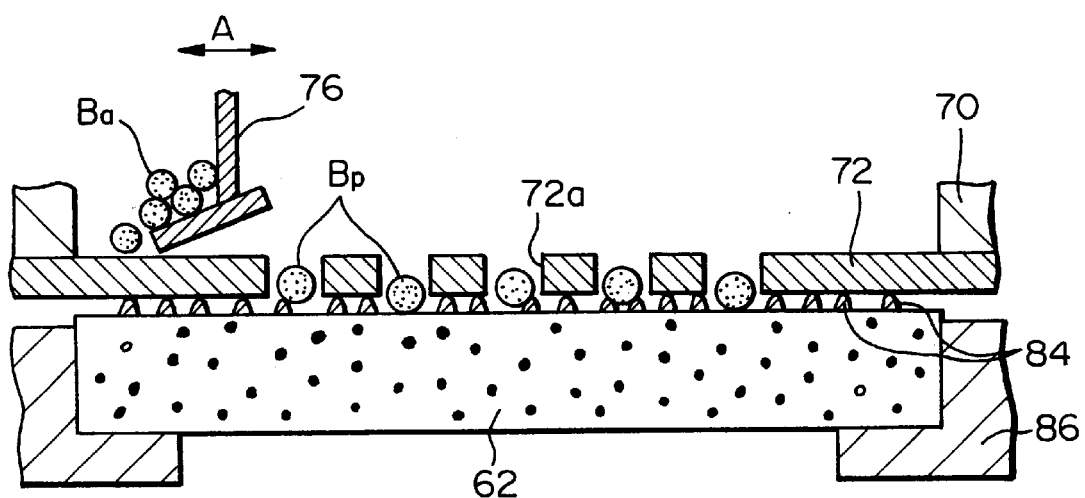
FIGS. 12–17 are sections each showing Example 2 of the second embodiment in a particular condition.

First, as shown in FIG. 12, the mask 72 and stage 62 are positioned close to each other, and each is held in its horizontal position. The bumps Bp each is received in one of the openings 72a. The bumps Bp are implemented as resin beads plated with Ni (nickel) and Au (gold) in a laminate structure. The excess bumps Bp not received in the openings 72a are collected by the squeegee 76 moving back and forth in the direction A.

Figure 13:
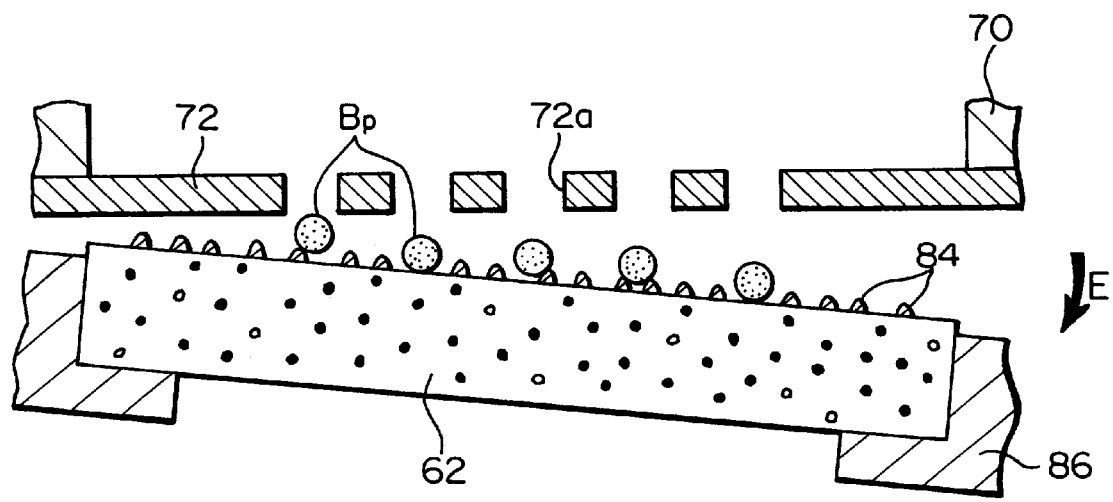

Subsequently, as shown in FIG. 13, the elevatable base 91 is operated to move the stage 62 away from the mask 72. In the initial stage of the separation, the tilting movement stated earlier may be effected in order to prevent air from sharply flowing into the gap between the mask 72 and the stage 62. This maintains the accurate arrangement of the bumps Bp. Thereafter, the stage 62 is lowered in the direction B to a level at which the stage 62 can be conveyed out of the bump arranging section 60A. It is to be noted that the stage 62 can be restored to its horizontal position at the time when the influence of the stream of air has become negligible.

Figure 14:
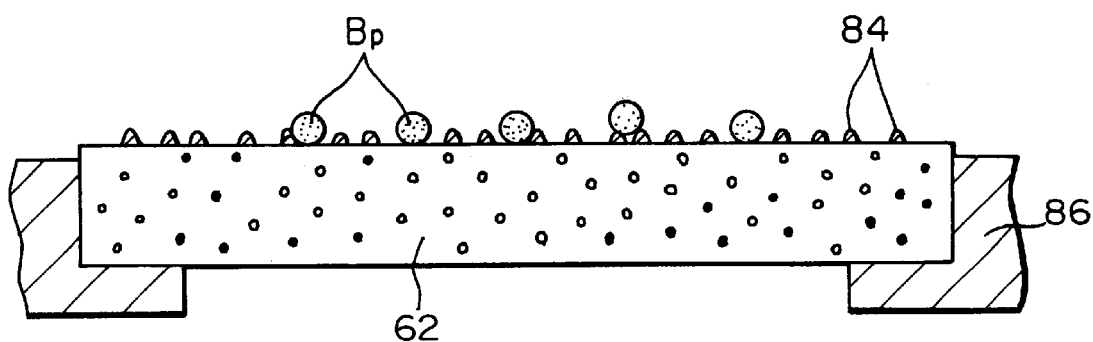

FIG. 14 shows a condition wherein the stage 62 is fully separated from the mask 72, and the bumps Bp are arranged on the stage 62. Because the fine lugs 84 are irregularly arranged on the stage 62, some bumps Bp are trapped between nearby lugs 84 while the other bumps B rest on a plurality of nearby lugs 84. Although the height above the stage surface slightly differs from one bump Bp to another bump Bp, the difference is only less than 10 μm.

Figure 15:
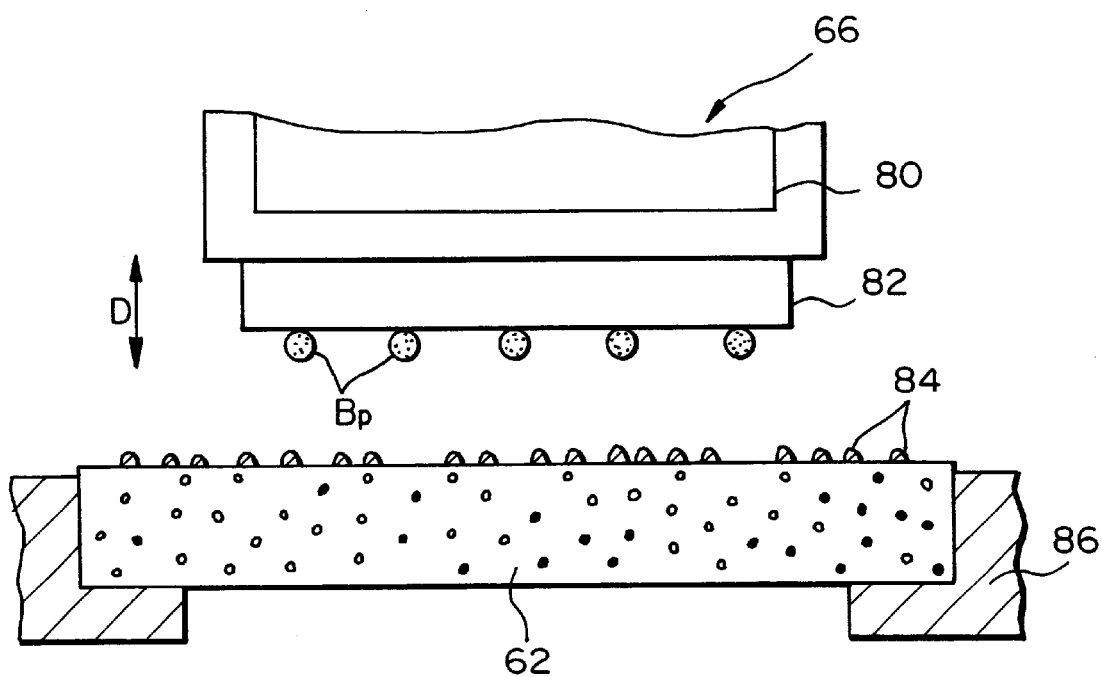

Subsequently, the base 91 is moved in the direction C in order to convey the stage 62 out of the bump arranging section 60B. Then, as shown in FIG. 15, the transfer head 66 was lowered in the direction D until the bumps Bp adhered to the surface of the quartz window 82 applied with the adhesive material. In Example 2, the bumps Bp existed on the stage 62 in their bare state. This, coupled with the fact that the adhesive material absorbed the difference in height between the bumps Bp and sufficiently contacted all the bumps Bp, allowed the bumps Bp to be shifted to the head 66 without exception.

Figure 16:
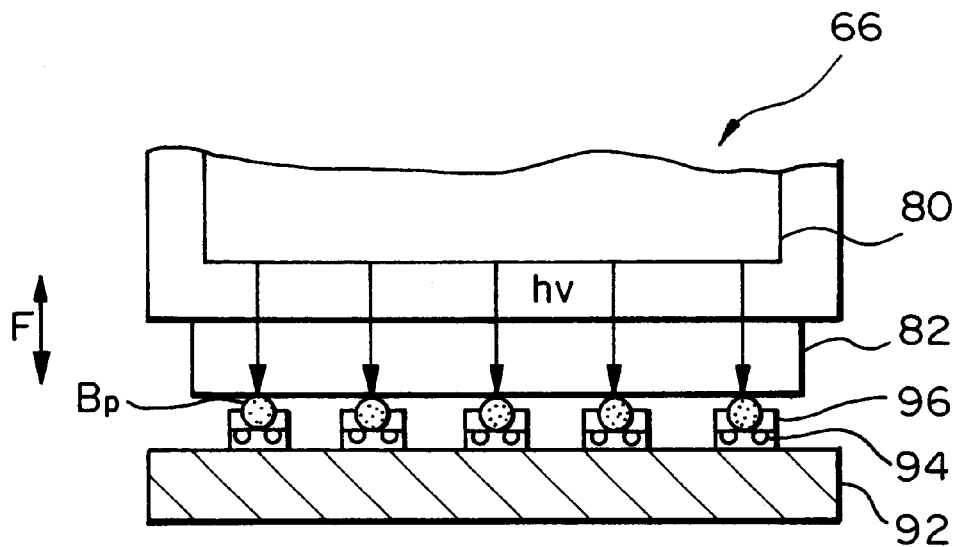
Figure 17:
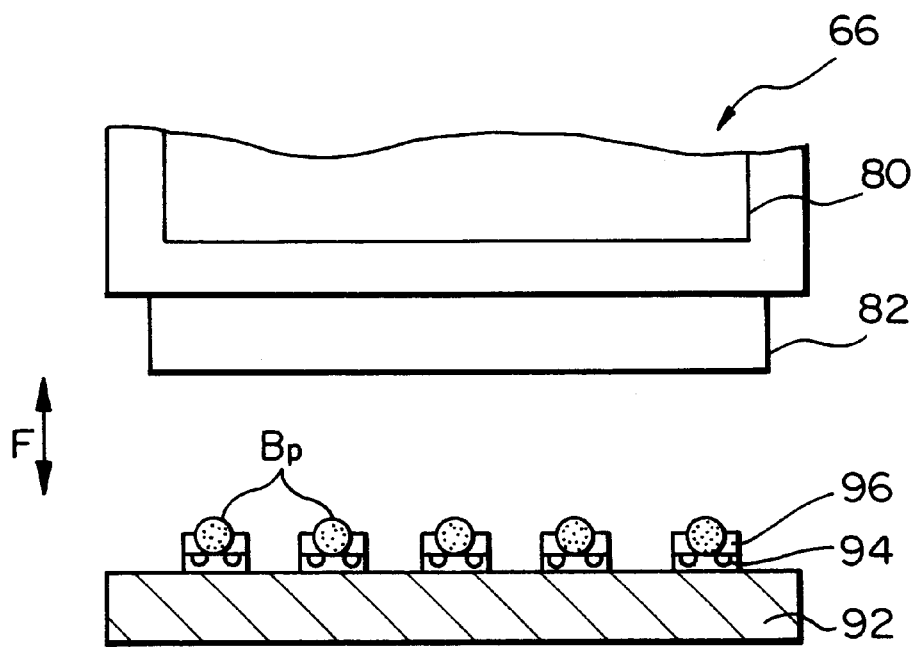

As shown in FIG. 16, the head 66 was moved to a position above an LSI chip 92 in order to align the bumps Bp with the electrode pads 94 of the chip 92. Then, the head 66 was lowered in the direction 66. The surfaces of the electrode pads 94 are covered with UV curable adhesive layers 96 beforehand. After the bumps Bp on the head 66 contacted the adhesive layers 96, UV rays hv were radiated from the optics 80. The UV rays hv caused the adhesive layers 96 to set via the quartz window 82. As a result, the bumps Bp were fixed to the electrode pads 94 as shown in FIG. 17.

Finally, the head 66 is raised away from the chip 92.

This is the end of the bump transfer procedure of Example 2.

EXAMPLE 3

Figure 18:
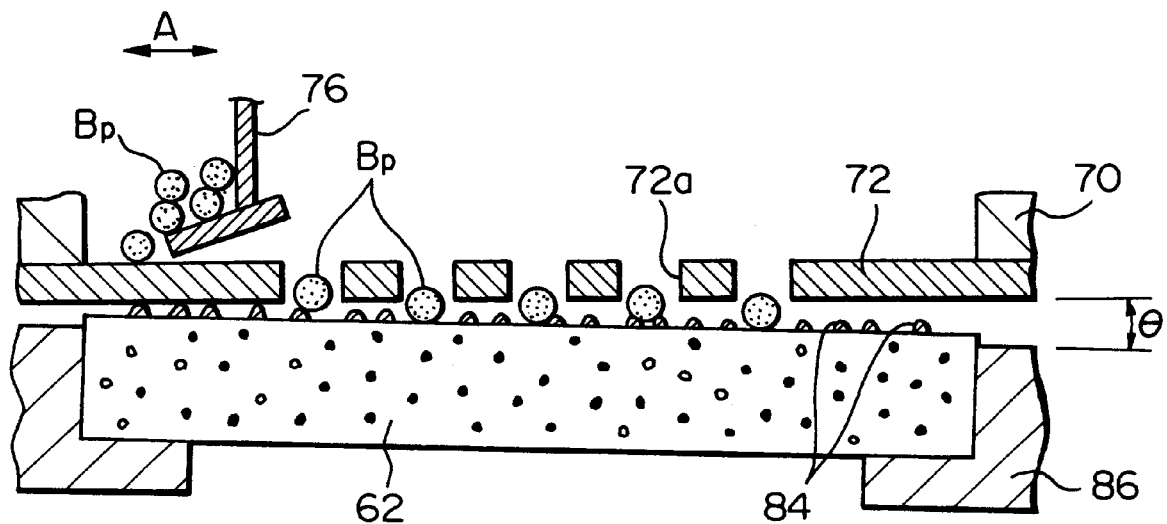
FIG. 18 is a section showing Example 3 of the second embodiment.

In Example 3, the stage 62 is slightly tilted from the horizontal at the time of arrangement of the bumps Bp thereon in order to protect the arrangement of the bumps Bp from a stream of air. Specifically, as shown in FIG. 18, the bumps Bp were arranged on the stage 62 inclined by an angle of θ from the horizontal via the base 91. The angle θ is free to choose so long as the bumps Bp do not escape from the openings 72a of the mask 72. After the arrangement of the bumps Bp, the stage 62 and mask 72 may be separated from each other by the method described in relation to Example 2.

EXAMPLE 4

Figure 19:
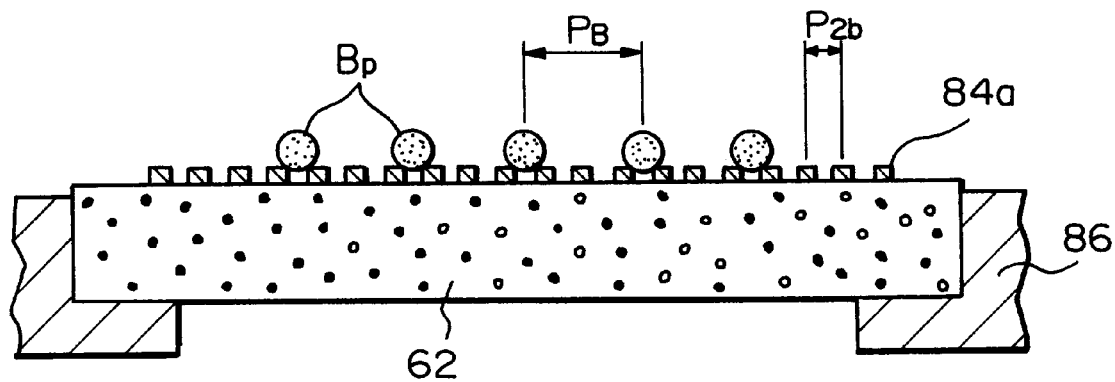
FIGS. 19 and 20 are sections each showing Example 4 of the second embodiment in a particular condition.
Figure 20:
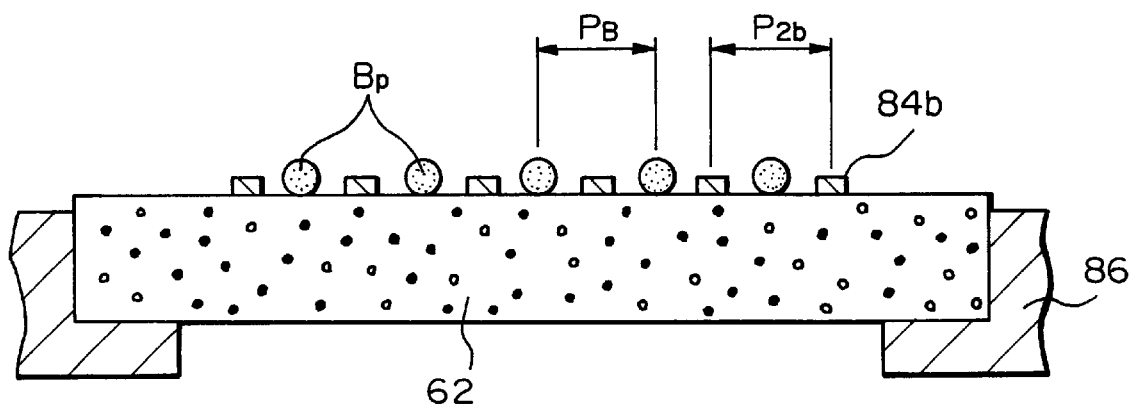

As shown in FIGS. 19 and 20, in this example, the fine lugs 84 on the stage 62 are replaced with fine lugs 84a formed in a regular pattern by photolithography. Specifically, the lugs 84a are implemented as a resist pattern formed by the selective exposure and development of a photoresist film provided on the stage 62.

As shown in FIG. 19, when the pitch $P_{2b}$ of the lugs 84a is sufficiently smaller than the pitch $P_B$ of the bump Bp, the bumps Bp rest on the lugs 84a without contacting the particle arranging surface of the stage 62. As shown in FIG. 20, when the pitch $P_{2b}$ is sufficiently greater than the pitch $P_B$, the bumps Bp contact the particle arranging surface of the stage 62 between the adjacent lugs 84b.

EXAMPLE 5

Figure 21:
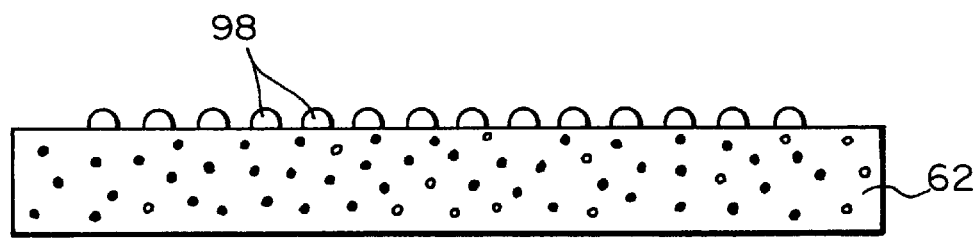
FIG. 21 is a section showing Example 5 of the second embodiment.

In this example, the fine lugs on the stage 62 are provided with tackiness. As shown in FIG. 21, the fine lugs are constituted by an adhesive resin buried layer 98 which may be formed by use of a silicone resin. A method of forming the layer 98 will be described with reference to FIGS. 22 and 23.

Figure 22:
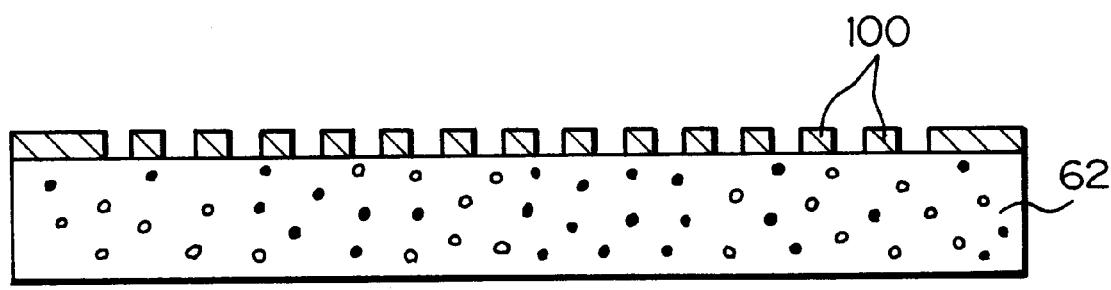
FIGS. 22 and 23 are sections each sowing Example 5 in a particular condition.
Figure 23:
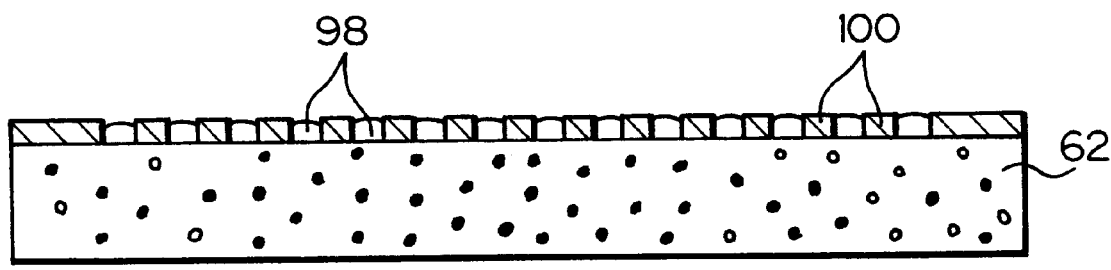

First, as shown in FIG. 22, conventional resist patterning was effected on the stage 62 in order to form a resist pattern 100. Then, as shown in FIG. 23, the adhesive resin buried layer 98 was formed such that a silicone resin filled the spaces of the resist pattern 100. After the setting of the silicone resin, the resist pattern 100 was removed by a peeling liquid. As a result, only the layer 98 was left on the stage 62, as shown in FIG. 21.

The fine lugs formed by the above procedure have tackiness themselves and retain the bumps Bp more positively than the fine lugs implemented by the previously stated UV curable resin. Therefore, even when a flow of air occurs at the time of separation of the stage 62 and mask 72, the disturbance to the arrangement of the bumps Bp can be minimized. In addition, to obviate the flow of air, the tilting angle of the stage 62 can be increased.

EXAMPLE 6

Figure 24:
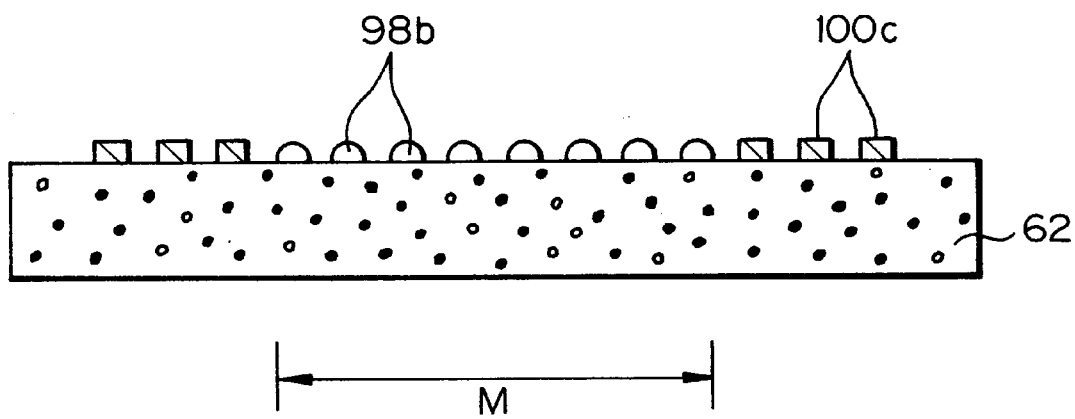
FIG. 24 is a section showing Example 6 of the second embodiment.

In this example, the fine lugs with tackiness are not formed over the entire particle arranging surface of the stage 62, but formed only in the region of the stage 62 adjoining the openings 72a of the mask 72. Specifically, as shown in FIG. 24, the fine lugs are constituted by an adhesive resin buried layer 98b and a resist pattern 100c. The layer 98b is selectively formed in a region M adjoining the openings 72a of the mask 72. For the layer 98b, use may be made of a silicone resin. The resist pattern 100c surrounds the above region M and is formed of a conventional positive type photoresist material. With this configuration, it is possible to free the mask 72 from contamination when the mask 72 and stage 62 are brought into contact.

Figure 25:
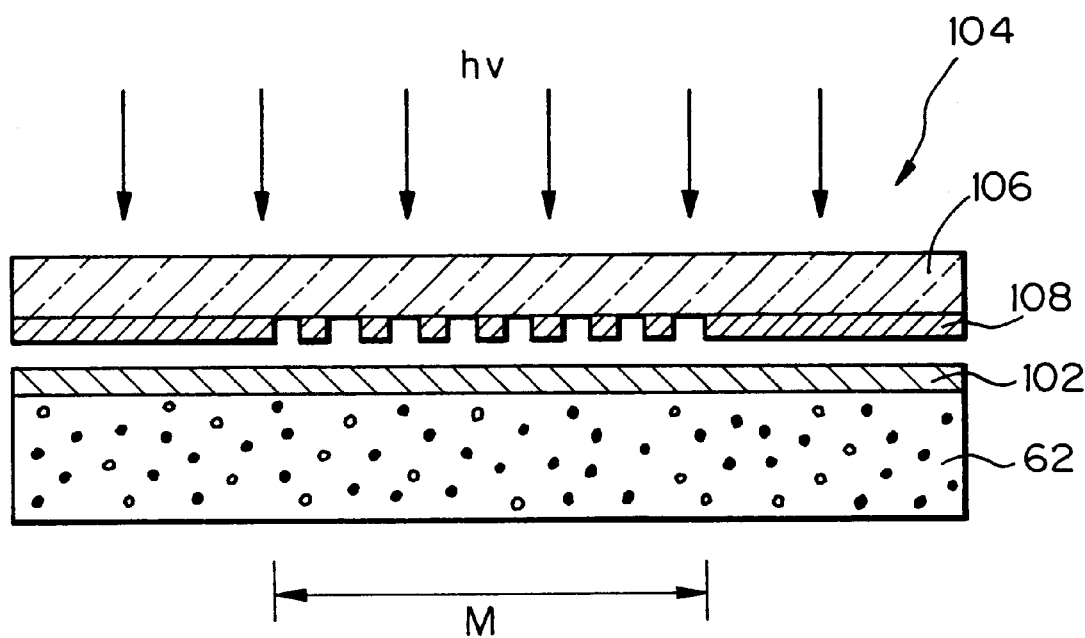
FIGS. 25–28 are sections each showing Example 6 in a particular condition.

FIGS. 25–28 show a procedure for forming the fine lugs of this example by two consecutive photolithographic steps. First, as shown in FIG. 25, a positive type photoresist film 102 formed on the stage 62 was subjected to the first selective exposure via a photomask 104. The photomask 104 is made up of a substrate 106 transparent for exposing light, and a Cr (chromium) film or similar light intercepting film pattern 108 formed on the substrate 106. The pattern 108 defines a position for forming the layer 98b (FIG. 27) in the region M. While the exposure is shown as being proximity exposure in FIG. 25, it may be contact exposure or projection exposure, if desired.

Figure 26:
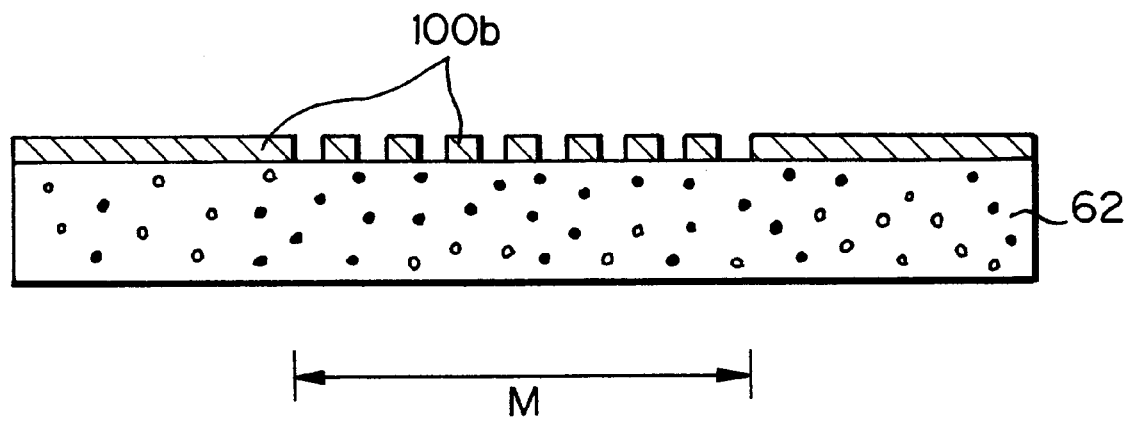
Figure 27:
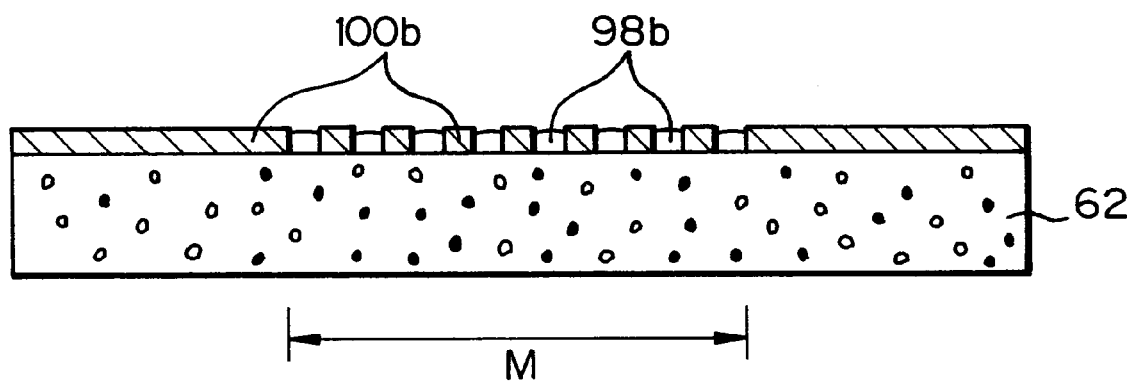

Subsequently, the exposed region of the photoresist film 102 was removed by the first development in order to form a resist pattern 100b shown in FIG. 26. Then, as shown in FIG. 27, the adhesive resin buried layer 98b was formed such that the spaces of the resist pattern 100b were filled with a silicone resin.

Figure 28:
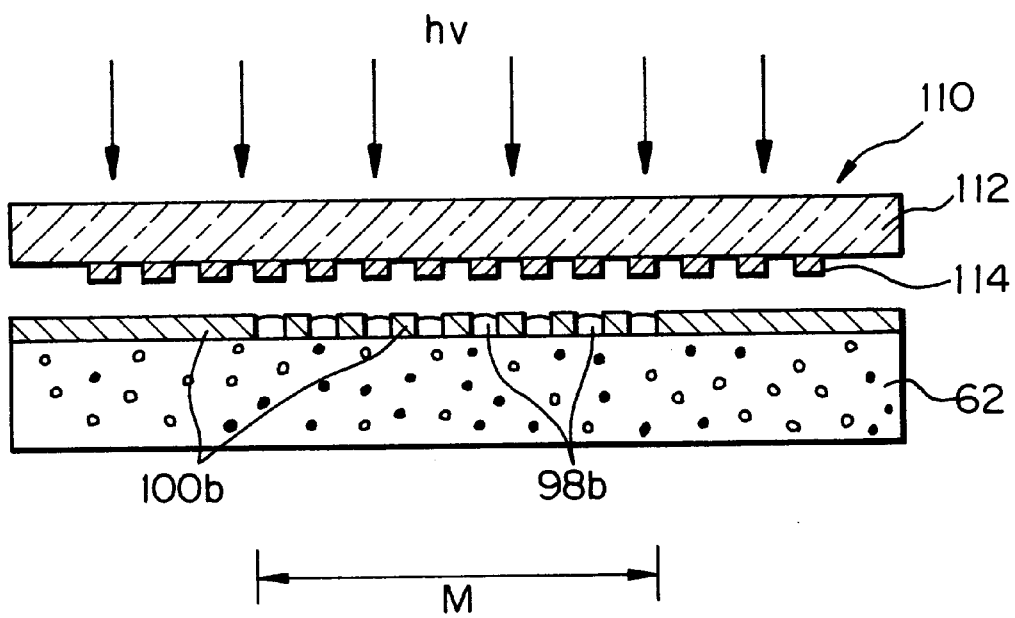

As shown in FIG. 28, after the setting of the above layer 98b, the resist pattern 100b on the stage 62 was subjected to the second selective exposure via a photomask 110. The photomask 110 is also made up of a substrate 112 transparent for exposing light, and a Cr film or similar light intercepting film pattern 114 formed on the substrate 112. The pattern 114 causes a new resist pattern 100c shown in FIG. 28 to be formed in the peripheral region around the region M. At the same time, the pattern 114 defines an exposure area for causing the resist pattern 100b existing in the region M to be removed.

After the second selective exposure, the second development was effected so as to produce the stage 62 shown in FIG. 24. As shown, the stage 62 has two different kinds of fine lugs each being confined in a respective region.

EXAMPLE 7

Figure 29:
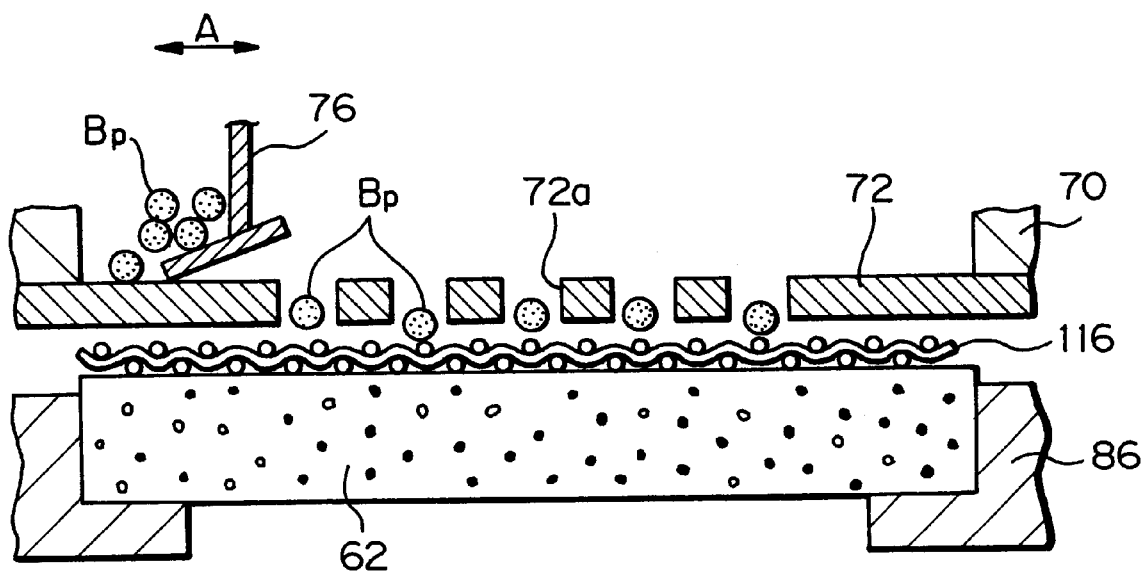
FIG. 29 is a section showing Example 7 of the second embodiment.

In this example, the fine lugs for retaining the bumps Bp are replaced with a mesh 116 laid on the stage 62. As shown in FIG. 29, the mesh 116 is laid on the stage 62 such that the bumps Bp trapped in the openings 72a of the mask 72 are arranged on the mesh 116. The mesh 116 is formed of, e.g., stainless steel. The mesh size of the mesh 116 is selected to be sufficiently smaller than the diameter of the bumps Bp, yet to surely retain the bumps Bp. In Example 7, the apertures of the mesh were about 20 µm.

The bumps Bp may be arranged on the stage 62 and then transferred by the previously stated procedure.

While this example maintains both the stage 62 and mask 72 horizontal at the time of arrangement of the bumps Bp, the stage 62 may be slightly tilted from the horizontal via the elevatable base 91 in the same manner as in Example 3. Further, when the stage 62 and mask 72 are separated from each other, the stage 62 may advantageously be lowered while being tilted, as in Example 1.

The illustrative embodiment is not limited to Examples 1–7 shown and described. For example, the bumps Bp arranged on the stage 62 and brought to the bump transferring section 60B may be directly bonded to the leads of a TAB tape by a conventional bonding tool, i.e., without using the transfer head 66. The kinds and sizes of the bumps Bp, the sizes of the openings of the mask and mesh, the dimension of the fine lugs, and the details of the particle arranging device shown and described are only illustrative. In addition, this embodiment is applicable not only to the bumps Bp but also to other various kinds of particles.

In summary, in the illustrative embodiment, bumps can be easily and surely arranged and transferred without resorting to strict control over the diameter of the bumps, the flatness of the leads of a TAB tape, the flatness of a bonding tool, and the parallelism of a stage and a TAB tape or an LSI chip. This successfully increases the yield of bonding using the TAB system or the flip-chip bonding system, and thereby enhances the productivity of semiconductor devices.

Various modifications will become possible for those skilled in the art after receiving the teachings of the present disclosure without departing from the scope thereof.

What is claimed is:

1. A device for arranging conductive particles for connecting electric circuit boards, comprising:
   a mask including openings in a preselected pattern for arranging the conductive particles;
   a squeegee spaced from said mask by a preselected distance and movable over said mask in a preselected direction and configured to fill the conductive particles in said openings of said mask;
   a stage positioned below said mask and configured to hold the conductive particles filled in said openings of said mask;
   a vacuum suction mechanism positioned below said stage and configured to suck, via said stage, the conductive particles being moved on said mask by said squeegee into said openings of said mask; and
   a drive mechanism configured to control an inclination angle between the stage and the mask so as to prevent air from flowing into a gap between the mask and the stage,
   wherein projections smaller than a diameter of the conductive particles protrude from an edge of said squeegee adjoining said mask, and
   wherein said squeegee is movable with said projections contacting said mask.

2. A device as claimed in claim 1, wherein said stage comprises a sintered ceramic body.

3. A device as claimed in claim 1, wherein the distance between said squeegee and said mask is smaller than a diameter of the conductive particles.

4. A device as claimed in claim 1, wherein said squeegee has a thickness smaller than a diameter of the conductive particles at at least an edge portion thereof contacting the conductive particles.

5. A device as claimed in claim 1, wherein said squeegee is flat and positioned at an angle of less than 30 degrees inclusive relative to said mask.

6. A device as claimed in claim 1, wherein said mask has a thickness greater than one-half of a diameter of the conductive particles, but smaller than said diameter.

7. A device as claimed in claim 1, wherein said vacuum suction mechanism includes a suction chamber formed below said stage and including two compartments respectively corresponding to a center portion and a peripheral portion of said mask surrounding said center portion.

8. A device as claimed in claim 1, wherein said mask is formed of a preselected resin.

9. A device for arranging conductive particles, comprising:
   feeding means for feeding the conductive particles;
   a stage comprising a porous flat plate having opposite major surfaces, one of said opposite major surfaces expected to arrange the conductive particles being implemented as fine irregular surface for restricting a movement of the conductive particles;
   a mask formed with openings in a preselected pattern for defining an arrangement of the conductive particles on said stage;
   sucking means for sucking the conductive particles via the other major surface of said stage to thereby retain the conductive particles on the one major surface of said stage; and
   drive means drivably connected to at least one of said stage and said mask for selectively moving said one major surface of said stage and a major surface of said mask toward or away from each other.

10. A device as claimed in claim 9, wherein said irregular surface of said stage is formed by fine lugs arranged on said one major surface of said stage.

11. A device as claimed in claim 10, wherein said fine lugs are arranged at a pitch smaller than a pitch at which the conductive particles are arranged.

12. A device as claimed in claim 10, wherein said fine lugs are arranged at a pitch equal to or greater than a pitch at which the conductive particles are arranged.

13. A device as claimed in claim 10, wherein at least a part of said fine lugs have tackiness to act on the conductive particles.

14. A device as claimed in claim 13, wherein the tackiness is provided in a region of said one major surface of said stage adjoining said openings of said mask.

15. A device as claimed in claim 9, wherein said irregular surface of said stage is formed by a mesh laid on said one major surface of said stage and having a mesh size smaller than a diameter of the conductive particles.

16. A device as claimed in claim 15, wherein at least a part of said mesh has tackiness to act on the conductive particles.

17. A device as claimed in claim 16, wherein the tackiness is provided in a region of said mesh adjoining said openings of said mask.

18. A device as claimed in claim 9, wherein said drive means includes a tilting mechanism for causing said stage and said mask to tilt by a small angle from parallel positions thereof.

19. A device as claimed in claim 9, wherein said drive means is connected only to said stage to thereby move said stage up and down relative to said mask fixed in place.

20. A device as claimed in claim 9, wherein said openings of said mask each is sized to trap a single conductive particle, and wherein said conductive particles comprise conductive particles for forming solder bumps.

21. A device for arranging conductive particles for connecting electric circuit boards, comprising:

- a mask including openings in a preselected pattern for arranging the conductive particles;
- a squeegee spaced from said mask by a preselected distance and movable over said mask in a preselected direction, and configured to fill the conductive particles in said openings of said mask;
- a stage positioned below said mask and configured to hold the conductive particles filled in said openings of said mask; and
- a vacuum suction mechanism positioned below said stage and configured to suck, via said stage, the conductive particles being moved on said mask by said squeegee into said openings of said mask, wherein projections smaller than a diameter of the conductive particles protrude from an edge of said squeegee adjoining said mask, and wherein said squeegee is movable with said projections contacting said mask.

* * * * *